(12) United States Patent
Koo et al.

(10) Patent No.: US 10,324,630 B2
(45) Date of Patent: Jun. 18, 2019

(54) MEMORY SYSTEM AND OPERATING METHOD THEREOF

(71) Applicant: SK hynix Inc., Gyeonggi-do (KR)

(72) Inventors: Duck-Hoi Koo, Gyeonggi-do (KR); Yong Jin, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/910,378

(22) Filed: Mar. 2, 2018

(65) Prior Publication Data

US 2019/0050147 A1 Feb. 14, 2019

(30) Foreign Application Priority Data

Aug. 8, 2017 (KR) .................. 10-2017-0100073

(51) Int. Cl.
*G11C 7/00* (2006.01)
*G06F 3/06* (2006.01)
*G11C 16/04* (2006.01)

(52) U.S. Cl.
CPC ............ *G06F 3/061* (2013.01); *G06F 3/0634* (2013.01); *G06F 3/0653* (2013.01); *G06F 3/0658* (2013.01); *G06F 3/0679* (2013.01); *G11C 16/0483* (2013.01)

(58) Field of Classification Search
CPC ... G11C 7/04; G11C 11/406; G11C 11/40626; G11C 5/147; G11C 5/143
USPC .............................. 365/211, 189.07
See application file for complete search history.

(56) References Cited

U.S. PATENT DOCUMENTS 9,257,167 B2* 2/2016 Fujita ................... G11C 11/1675
2016/0034189 A1* 2/2016 Kim ......................... G06F 3/061
711/103

FOREIGN PATENT DOCUMENTS

KR 1020160038642 4/2016

* cited by examiner

*Primary Examiner* — Son T Dinh
(74) *Attorney, Agent, or Firm* — IP & T Group LLP

(57) ABSTRACT

A memory system includes a controller and a plurality of nonvolatile memories; a temperature control unit suitable for measuring a temperature of each of the plurality of nonvolatile memories, and comparing each measured temperature with a predetermined threshold value; a signal generation unit generating busy signals corresponding to one or more of the nonvolatile memories when the measured temperature is higher than the predetermined threshold value; and an interface unit transmitting the busy signal to the controller.

18 Claims, 10 Drawing Sheets

MEMORY SYSTEM AND OPERATING METHOD THEREOF

CROSS-REFERENCE TO RELATED APPLICATIONS

The present application claims priority of Korean Patent Application No. 10-2017-0100073, filed on Aug. 8, 2017, which is incorporated herein by reference in its entirety.

BACKGROUND

1. Field

Exemplary embodiments of the present invention relate to a memory system, and more particularly, to an improved memory system for a more efficient management of data with a memory device, and a method for operating the memory system.

2. Description of the Related Art

The computer environment paradigm has changed to ubiquitous computing systems that may be used anytime and anywhere. Due to this fact, use of portable electronic devices such as mobile phones, digital cameras, and notebook computers has rapidly increased. These portable electronic devices generally use a memory system employing one or more memory devices for storing data. A memory system may be used as a main memory device or an auxiliary memory device of a portable electronic device.

Memory systems provide excellent stability, durability, high information access speed, and low power consumption since they have no moving parts. Examples of memory systems having such advantages include universal serial bus (USB) memory devices, memory cards having various interfaces, and solid state drives (SSD).

SUMMARY

Embodiments of the present invention are directed to a memory system that is capable of maintaining an optimal temperature of a memory device employed by the memory system, and a method for operating the memory system. The memory system may adjust the temperature of the memory device more efficiently adding less load to the controller of the memory system. Thus, the memory system may manage data storing and retrieving to and from the memory device more efficiently. The memory device may preferably be a non-volatile memory device, and even more preferably a three-dimensional nonvolatile memory device. In an embodiment the memory device may be a flash memory device.

In accordance with an embodiment of the present invention, a memory system comprises: a controller; and a plurality of nonvolatile memories; a temperature control unit suitable for measuring a temperature of each of the plurality of nonvolatile memories, and comparing each measured temperature with a predetermined threshold value; a signal generation unit suitable for generating busy signals corresponding to one or more of the nonvolatile memories when each of the measured temperature is higher than the predetermined threshold value; and an interface unit transmitting the busy signal to the controller.

The controller may controls the plurality of nonvolatile memories to perform operations by providing commands, and wherein the plurality of nonvolatile memories generate response corresponding to the provided commands.

The interface unit transmits the busy signal along with the responses.

The controller may control, when receiving the busy signals, one or more nonvolatile memories corresponding to the received busy signals not to perform the input/output operations.

The busy signal may consist of the one or more bits added to the respective responses.

The signal generation unit may further generate ready signal corresponding to one or more of the nonvolatile memories when each of the measured temperature is equal to or lower than the predetermined threshold value, and wherein the controller-memory device interface unit may further transmit the ready signal to the controller.

The interface unit transmits the ready signals along with the responses.

The controller controls, when receiving the ready signals, one or more memories corresponding to the received busy signals to perform input/output operations.

The ready signal may consist of one or more bits added to the respective responses.

The controller controls the memory device to set the predetermined threshold temperature based on a command issued from a host, and wherein the at least one memory is a nonvolatile memory.

The controller may control the memory device to set the threshold value based on a command issued from the host.

In accordance with another embodiment of the present invention, a method for operating a memory system comprises: measuring, by a memory device, a temperature of each of a plurality of nonvolatile memories; comparing each of the measured temperature with a predetermined threshold value; generating, by the memory device, busy signals corresponding to one or more of the nonvolatile memories when the measured temperature is higher than the predetermined threshold value; and transmitting, by the memory device, the busy signal to the controller.

A method for operating a memory system may further comprise: controlling, by a controller, the plurality of nonvolatile memories to perform operations by providing commands; and generating by the memory device, response corresponding to the provided commands.

The busy signal may be transmitted along with the response. The selecting of the first memory blocks among the memory blocks based on the first parameters may further include: detecting a distribution degree of valid pages that are included in the memory blocks based on the first threshold value.

The method for operating a memory system may further comprise controlling, by the controller when receiving the busy signals, one or more nonvolatile memories corresponding to the received busy signals not to perform input/output operations.

The busy signal may consist of one or more bits added to the respective response.

The method for operating a memory system may further comprise generating, by the memory device, ready signals corresponding to one or more of the nonvolatile memories when each of the measured temperature value is equal to or lower than the predetermined threshold value; and transmitting, by the memory device, the ready signal to the controller.

The ready signal may be transmitted along with the response.

The method for operating a memory system may further comprise controlling, by the controller when receiving the ready signals, one or more memories corresponding to the received busy signals to perform input/output operations.

The ready signal consists of one or more bits added to the respective responses.

The method for operating a memory system may further comprise controlling, by the controller, the memory device to set the threshold value based on a command issued from a host before the measuring of the temperature.

A memory system comprises: a memory device including one or more memory cores, and suitable for providing busy signals indicating one or more among the memory cores when the one or more among the memory cores have higher temperature than a threshold; and a controller suitable for throttling the one or more among the memory cores according to the busy signals.

A memory system comprises: a controller; a memory device comprising at least one memory, wherein the memory system is suitable for: measuring a temperature of the at least one memory, comparing the measured temperature with a predetermined threshold temperature, for generating a busy or a ready signal corresponding to the at least one memory based on the comparison of the measured temperature with the predetermined threshold temperature, and adding the busy or ready signal to a response transmitted by the memory device to the controller.

The response may correspond to an operation performed by the memory device to the at least one memory based on a command provided by the controller.

The memory device may be further suitable for transmitting the response along with the busy or ready signal to the controller.

The controller may control the memory device not to perform an input/output operation to the at least one memory when the signal in the response is a busy signal, and wherein the controller controls the memory device to perform the input/output operation to the at least one memory when the signal in the response is a ready signal.

The busy signal may consist of one or more bits added to the response.

The memory device may generate the busy signal when the measured temperature is greater than the predetermined threshold temperature and generates the ready signal when the measured temperature is equal to or lower than the predetermined threshold temperature.

The ready signal may consist of one or more bits added to the response.

The controller may control the memory device to set the predetermined threshold temperature based on a command issued from a host, and wherein the at least one memory is a nonvolatile memory.

The memory system may further comprise a temperature control unit for measuring the temperature of the at least one memory, and for comparing the measured temperature with the predetermined threshold temperature.

The memory system may further comprise a signal generation unit for generating the busy or the ready signal corresponding to the at least one memory based on the comparison of the measured temperature with the predetermined threshold temperature and for adding the busy or ready signal to the response transmitted by the memory device to the controller.

DETAILED DESCRIPTION

Figure 1:
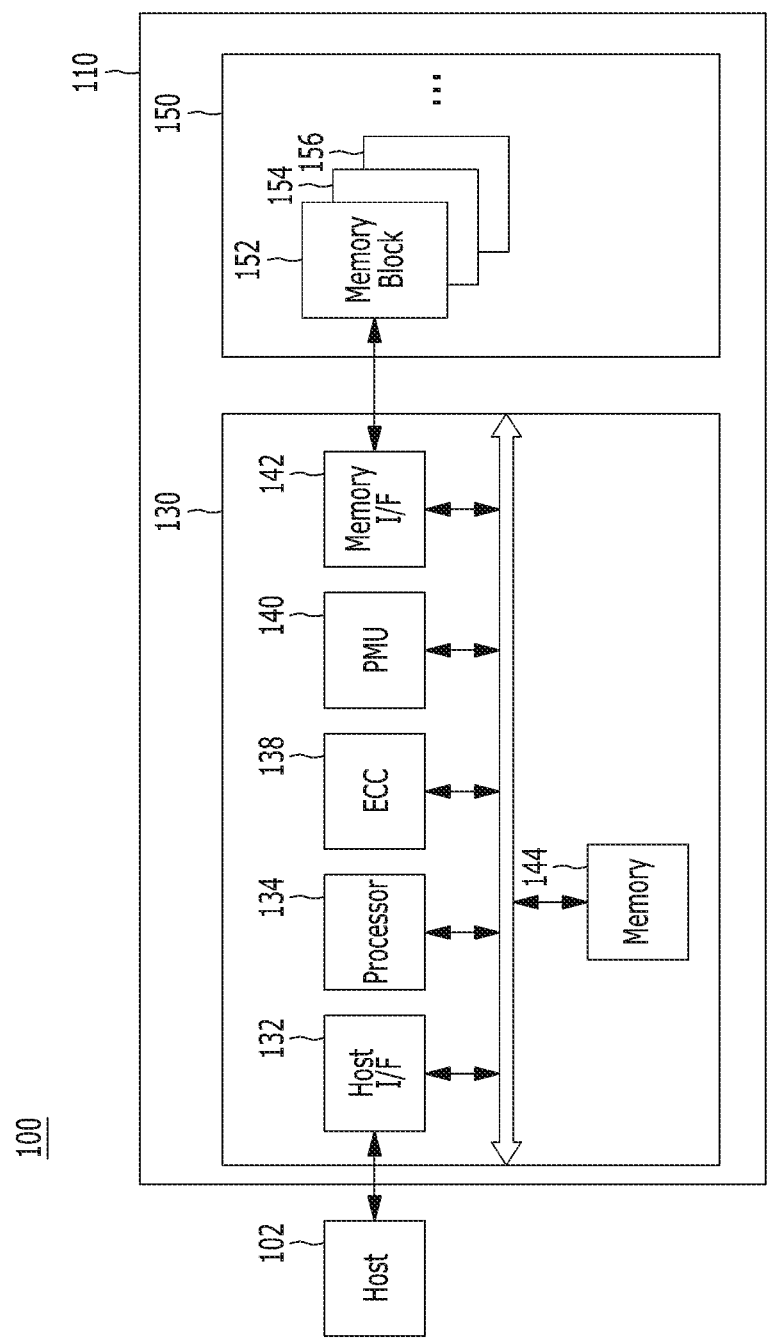
FIG. 1 is a block diagram illustrating a data processing system in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include portable electronic devices such as a mobile phone, MP3 player and laptop computer or non-portable electronic devices such as a desktop computer, game machine, TV and projector.

The host 102 may include at least one OS (operating system), and the OS may manage and control overall functions and operations of the host 102, and provide an operation between the host 102 and a user using the data processing system 100 or the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix. Furthermore, the mobile OS configured to support a function of providing a mobile service to users and a power saving function of a system may include Android, iOS and Windows Mobile. At this time, the host 102 may include a plurality of OSs, and execute an OS to perform an operation corresponding to a user's request on the memory system 110.

The memory system 110 may operate to store data for the host 102 in response to a request of the host 102. Non-limited examples of the memory system 110 may include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC, and the. The SD card may include a mini-SD card and micro-SD card.

The memory system 110 may be embodied by various types of storage devices. Non-limited examples of storage devices included in the memory system 110 may include volatile memory devices such as a DRAM dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory. The flash memory may have a 3-dimensional (3D) stack structure.

The memory system 110 may include a memory device 150 and a controller 130. The memory device 150 may store data for the host 102, and the controller 130 may control data storage into the memory device 150.

The controller 130 and the memory device 150 may be integrated into a single semiconductor device, which may be included in the various types of memory systems as exemplified above. For example, the controller 130 and the memory device 150 may be integrated as one semiconductor device to constitute an SSD. When the memory system 110 is used as an SSD, the operating speed of the host 102 connected to the memory system 110 may be improved. In addition, the controller 130 and the memory device 150 may be integrated as one semiconductor device to constitute a memory card. For example, the controller 130 and the memory device 150 may constitute a memory card such as a PCMCIA (personal computer memory card international association) card, CF card, SMC (smart media card), memory stick, MMC including RS-MMC and micro-MMC, SD card including mini-SD, micro-SD and SDHC, or UFS device.

Non-limited application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory blocks 152 to 156, each of the memory blocks 152 to 156 may include a plurality of pages, and each of the pages may include a plurality of memory cells coupled to a word line. In an embodiment, the memory device 150 may be a flash memory. The flash memory may have a 3-dimensional (3D) stack structure.

Herein, since the structure of the memory device 150 and the 3D stack structure of the memory device 150 will be described in detail later with reference to FIGS. 2 to 4, further description on them will be omitted herein.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) unit 132, a controller processor 134, an error correction code (ECC) unit 138, a Power Management Unit (PMU) 140, a NAND flash controller (NFC) 142 and a controller memory 144 all operatively coupled via an internal bus.

The host interface unit 134 may be configured to process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC unit 138 may detect and correct an error contained in the data read from the memory device 150. In other words, the ECC unit 138 may perform an error correction decoding process to the data read from the memory device 150 through an ECC code used during an ECC encoding process. According to a result of the error correction decoding process, the ECC unit 138 may output a signal, for example, an error correction success/fail signal. When the number of error bits is more than a threshold value of correctable error bits, the ECC unit 138 may not correct the error bits, and may output an error correction fail signal.

The ECC unit 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC unit 138 is not limited thereto. The ECC unit 138 may include all circuits, modules, systems or devices for error correction.

The PMU 140 may provide and manage power of the controller 130.

The NFC 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the NFC 142 may generate a control signal for the memory device 150 and process data to be provided to the memory device 150 under the control of the controller processor 134. The NFC 142 may work as an interface (e.g., a NAND flash interface) for processing a command and data between the controller 130 and the memory device 150. Specifically, the NFC 142 may support data transfer between the controller 130 and the memory device 150.

The controller memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The controller memory 144 may store data required for the controller 130 and the memory device 150 to perform these operations.

The controller memory 144 may be embodied by a volatile memory. For example, the controller memory 144 may be embodied by static random access memory (SRAM) or dynamic random access memory (DRAM). The controller memory 144 may be disposed within or out of the controller 130. FIG. 1 exemplifies the controller memory 144 disposed within the controller 130. In an embodiment, the controller memory 144 may be embodied by an external volatile memory having a memory interface transferring data between the controller memory 144 and the controller 130.

The controller processor 134 may control the overall operations of the memory system 110. The controller processor 134 may drive firmware to control the overall operations of the memory system 110. The firmware may be referred to as flash translation layer (FTL). Also, the controller processor 134 may be realized as a microprocessor or a Central Processing Unit (CPU).

For example, the controller 130 may perform an operation requested by the host 102 in the memory device 150 through the controller processor 134, which is realized as a microprocessor or a CPU. In other words, the controller 130 may perform a command operation corresponding to a command received from the host 102. Herein, the controller 130 may perform a foreground operation as the command operation corresponding to the command received from the host 102. For example, the controller 130 may perform a program operation corresponding to a write command, a read operation corresponding to a read command, an erase operation corresponding to an erase command, and a parameter set operation corresponding to a set parameter command or a set feature command as a set command.

Also, the controller 130 may perform a background operation onto the memory device 150 through the controller processor 134, which is realized as a microprocessor or a CPU. Herein, the background operation performed onto the memory device 150 may include an operation of copying and processing data stored in some memory blocks among the memory blocks 152, 154 and 156 of the memory device 150 into other memory blocks, e.g., a garbage collection (GC) operation, an operation of performing swapping between the memory blocks 152, 154 and 156 of the memory device 150 or between the data of the memory blocks 152, 154 and 156, e.g., a wear-leveling (WL) operation, an operation of storing the map data stored in the controller 130 in the memory blocks 152, 154 and 156 of the memory device 150, e.g., a map flush operation, or an operation of managing bad blocks of the memory device 150, e.g., a bad block management operation of detecting and processing bad blocks among the memory blocks 152, 154 and 156 included in the memory device 150.

Also, in the memory system in accordance with the embodiment of the present invention, for example, the controller 130 may perform a plurality of command operations corresponding to a plurality of commands received from the host 102, e.g., a plurality of program operations corresponding to a plurality of write commands, a plurality of read operations corresponding to a plurality of read commands, and a plurality of erase operations corresponding to a plurality of erase commands, in the memory device 150, and update metadata, particularly, map data, according to the performance of the command operations.

In particular, in the memory system in accordance with the embodiment of the present invention, when the controller 130 performs command operations corresponding to a plurality of commands received from the host 102, e.g., program operations, read operations, and erase operations, in the memory blocks included in the memory device 150, the operation reliability of the memory device 150 may be deteriorated and also the utility efficiency of the memory device 150 may decrease because characteristics are deteriorated in the memory blocks due to the performance of the command operations. Therefore, a copy operation or a swap operation may be performed in the memory device 150 in consideration of the parameters for the memory device 150 according to the performance of the command operations.

For example, in the memory system in accordance with the embodiment of the present invention, when the controller 130 performs program operations corresponding to a plurality of write commands received from the host 102 in the memory blocks included in the memory device 150, the controller 130 may perform a copy operation, e.g., a garbage collection operation, onto the memory device 150 in order to improve the utility efficiency of the memory device 150 included in the memory system 110.

Also, in the memory system in accordance with the embodiment of the present invention, when the controller 130 performs erase operations corresponding to a plurality of erase commands received from the host 102 in the memory blocks included in the memory device 150, each of the memory blocks included in the memory device 150 may have a limited erase count, and accordingly, the controller 130 may perform erase operations corresponding to the erase commands within range of the limited erase count. For example, when the controller 130 performs erase operations onto particular memory blocks while exceeding the limited erase count, the particular memory blocks may be processed as bad blocks, which may not be used any more. Herein, the limited erase count for the memory blocks of the memory device 150 may represent the maximal count that erase operations may be performed onto the memory blocks of the memory device 150. Therefore, in the memory system in accordance with the embodiment of the present invention, erase operations may be performed uniformly within the range of the limited erase count for the memory blocks of the memory device 150. Also, in order to secure operation reliability for the memory blocks of the memory device 150 from the erase operations, data may be processed with the memory blocks of the memory device 150 in consideration of the parameters of the memory blocks of the memory device 150, for example, a swap operation, e.g., a wear-leveling operation, may be performed in the memory device 150.

Also, in the memory system in accordance with the embodiment of the present invention, when the controller 130 performs read operations corresponding to a plurality of read commands received from the host 102 in the memory blocks included in the memory device 150, particularly, when the controller 130 repeatedly performs read operations in some particular memory blocks, read disturbance may be caused in the particular memory blocks due to the repeated read operations. Therefore, the controller 130 may perform a read reclaim operation to protect the particular memory blocks from losing data due to the read disturbance. In other words, in the memory system in accordance with the embodiment of the present invention, the controller 130 may copy and store the data stored in the particular memory blocks into other memory blocks through the read reclaim operation. In short, the controller 130 may perform a copy operation for the particular memory blocks in the memory device 150.

Herein, in the memory system in accordance with the embodiment of the present invention, the controller 130 may perform not only a swap operation and a copy operation but also a bad block management operation for some memory blocks in consideration of the parameters according to the performance of command operations corresponding to the commands received from the host 102, e.g., valid page counts (VPC) of the memory blocks of the memory device 150 according to the performance of program operations, erase counts according to the performance of erase operations, program counts according to the performance of program operations, and read counts according to the performance of read operations. Also, in the memory system in accordance with the embodiment of the present invention, the controller 130 may perform a copy operation, e.g., a garbage collection operation, onto the memory blocks of the memory device 150 in consideration of the parameters corresponding to not only the swap operation and the copy operation but also the bad block management operation that are performed in the memory blocks of the memory device 150. Herein, in the memory system in accordance with the embodiment of the present invention, since the performance of the command operations corresponding to a plurality of commands received from the host 102 and the performance of the swap operation and the copy operation performed in the memory device 150 in consideration of the parameters corresponding to the performance of the command operations will be described in detail later with reference to FIGS. 5 to 9, further description on it will be omitted herein.

The processor 134 of the controller 130 may include a management unit (not illustrated) for performing a bad management operation of the memory device 150. The management unit may perform a bad block management operation of checking a bad block, in which a program fail occurs due to a characteristic of the memory device, for example, a NAND flash memory during a program operation, among the plurality of memory blocks 152 to 156 included in the memory device 150. The management unit may write the program-failed data of the bad block to a new memory block. In a memory device 150 having a 3D stack structure, the bad block management operation may reduce the use efficiency of the memory device 150 and the reliability of the memory system 110. Thus, the bad block management operation needs to be performed with more reliability. Hereafter, the memory device of the memory system in accordance with the embodiment of the present invention is described in detail with reference to FIGS. 2 to 4.

Figure 2:
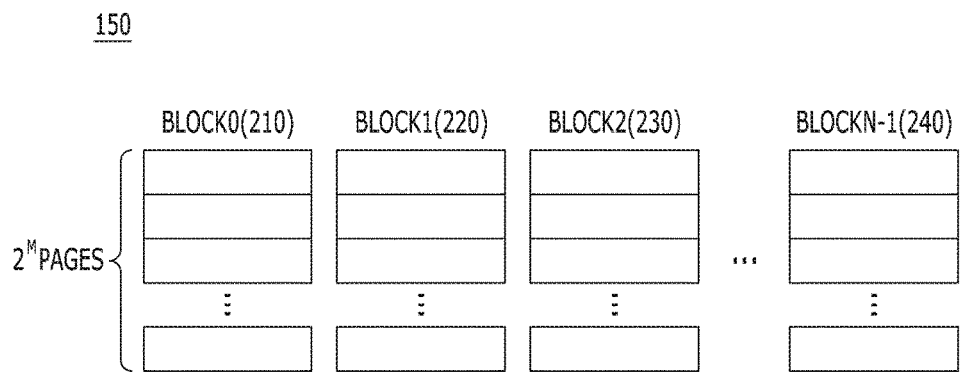
FIG. 2 is a schematic diagram illustrating an exemplary configuration of a memory device employed in a memory system shown in FIG. 1.
Figure 3:
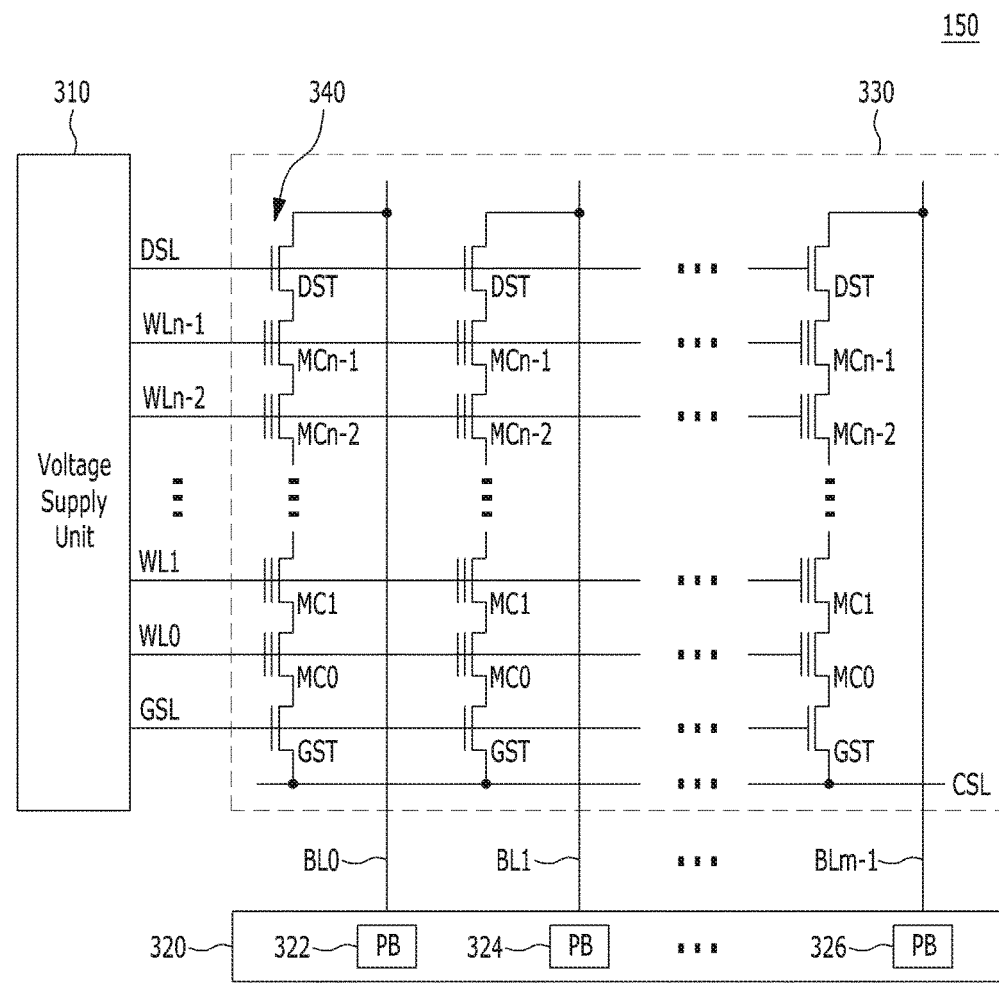
FIG. 3 is a circuit diagram illustrating an exemplary configuration of a memory cell array of a memory block in a memory device shown in FIG. 1.
Figure 4:
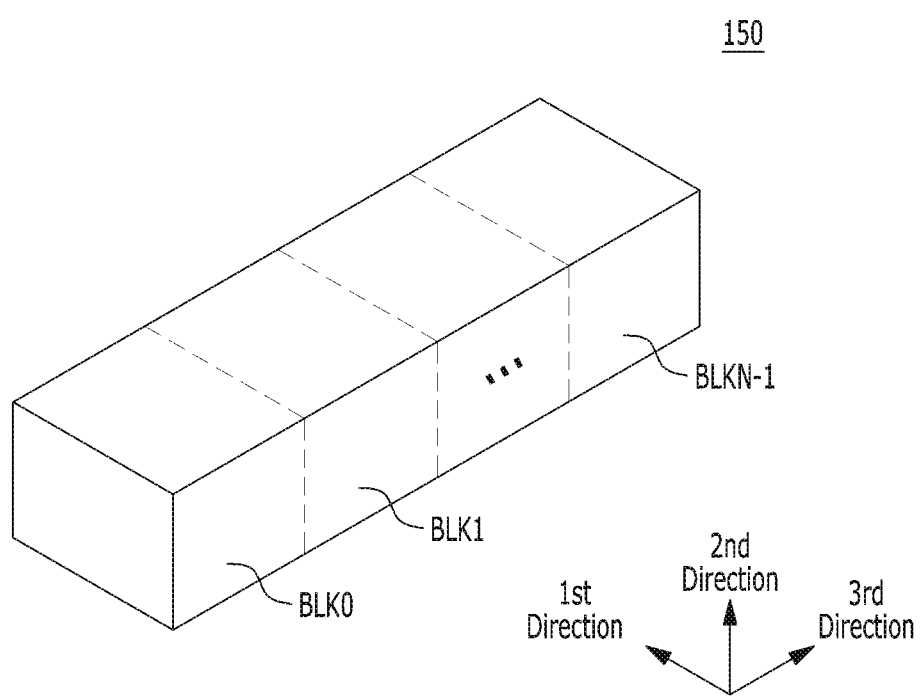
FIG. 4 is a block diagram illustrating a data processing system in accordance with an embodiment of the present invention.

FIG. 2 is a schematic diagram illustrating the memory device 150, FIG. 3 is a circuit diagram illustrating an exemplary configuration of a memory cell array of a memory block in the memory device 150 and FIG. 4 is a schematic diagram illustrating an exemplary 3D structure of the memory device 150.

Referring to FIG. 2, the memory device 150 may include a plurality of memory blocks 0 to N−1, e.g., a memory block 0 BLK0 210, a memory block 1 BLK1 220, a memory block 2 BLK2 230, and a memory block N−1 BLKN−1 240, and each of the memory blocks 210, 220, 230 and 240 may include a plurality of pages, for example, $2^M$ pages, the number of which may vary according to circuit design. Herein, although it is described for the sake of convenience in description that each of the memory blocks include $2^M$ pages, each of the memory blocks may include M pages as well. Each of the pages may include a plurality of memory cells that are coupled to a plurality of word lines WL.

Also, the memory device 150 may include a plurality of memory blocks, which may include a single level cell (SLC) memory block storing 1-bit data and/or a multi-level cell (MLC) memory block storing 2-bit data. Herein, the SLC memory blocks may include a plurality of pages that are realized by memory cells storing one-bit data in one memory cell. The SLC memory blocks may have a quick data operation performance and high durability. On the other hand, the MLC memory blocks may include a plurality of pages that are realized by memory cells storing multi-bit data, e.g., data of two or more bits, in one memory cell. The MLC memory blocks may have a greater data storing space than the SLC memory blocks. In other words, the MLC memory blocks may be highly integrated. Particularly, the memory device 150 may include not only the MLC memory blocks each of which includes a plurality of pages that are realized by memory cells capable of storing two-bit data in one memory cell, but also triple level cell (TLC) memory blocks each of which includes a plurality of pages that are realized by memory cells capable of storing three-bit data in one memory cell, quadruple level cell (QLC) memory blocks each of which includes a plurality of pages that are realized by memory cells capable of storing four-bit data in one memory cell, and/or multiple level cell memory blocks each of which includes a plurality of pages that are realized by memory cells capable of storing five or more-bit data in one memory cell, and so forth.

Herein, in accordance with the embodiment of the present invention, although it is described for the sake of convenience in description that the memory device 150 is a non-volatile memory, such as a flash memory, e.g., a NAND flash memory, the memory device 150 may be realized as one memory among a Phase Change Random Access Memory (PCRAM), a Resistive Random Access Memory (RRAM or ReRAM), a Ferroelectric Random Access Memory (FRAM), a Spin Transfer Torque Magnetic Random Access Memory (STT-RAM or STT-M RAM).

The memory blocks 210, 220, 230 and 240 may store the data transferred from the host 102 through a program operation, and transfer data stored therein to the host 102 through a read operation.

Subsequently, referring to FIG. 3, a memory block 330 which may correspond to any of the plurality of memory blocks 152 to 156 included in the memory device 150 of the memory system 110 may include a plurality of cell strings 340 coupled to a plurality of corresponding bit lines BL0 to BLm−1. The cell string 340 of each column may include one or more drain select transistors DST and one or more source select transistors SST. Between the drain and select transistors DST and SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, the invention is not limited in this way. It is noted that the memory cells may be NOR flash memory cells, or hybrid flash memory cells including two or more types of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply unit 310 which provides word line voltages including a program voltage, a read voltage and a pass voltage to supply to the word lines according to an operation mode. The voltage generation operation of the voltage supply unit 310 may be controlled by a control circuit (not illustrated). Under the control of the control circuit, the voltage supply unit 310 may select one of the memory blocks (or sectors) of the memory cell array, select one of the word lines of the selected memory block, and provide the word line voltages to the selected word line and the unselected word lines as may be needed.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

The memory device 150 may be embodied by a 2D or 3D memory device. Particularly, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1. Herein, FIG. 4 is a block diagram illustrating the memory blocks 152, 154 and 156 of the memory device 150 shown in FIG. 1. Each of the memory blocks 152, 154 and 156 may be realized in a 3D structure (or vertical structure). For example, the memory blocks 152, 154 and 156 may include structures of a three-dimensional structure that are extended in first to third directions, e.g., an x-axis direction, a y-axis direction, and a z-axis direction.

Each memory block 330 included in the memory device 150 may include a plurality of NAND strings NS that are extended in the second direction, and a plurality of NAND strings NS that are extended in the first direction and the third direction. Herein, each of the NAND strings NS may be coupled to a bit line BL, at least one string selection line SSL, at least one ground selection line GSL, a plurality of word lines WL, at least one dummy word line DWL, and a common source line CSL, and each of the NAND strings NS may include a plurality of transistor structures TS.

In short, each memory block 330 among the memory blocks 152, 154 and 156 of the memory device 150 may be coupled to a plurality of bit lines BL, a plurality of string selection lines SSL, a plurality of ground selection lines GSL, a plurality of word lines WL, a plurality of dummy word lines DWL, and a plurality of common source lines CSL, and each memory block 330 may include a plurality of NAND strings NS. Also, in each memory block 330, one bit line BL may be coupled to a plurality of NAND strings NS to realize a plurality of transistors in one NAND string NS. Also, a string selection transistor SST of each NAND string NS may be coupled to a corresponding bit line BL, and a ground selection transistor GST of each NAND string NS may be coupled to a common source line CSL. Herein, memory cells MC may be provided between the string selection transistor SST and the ground selection transistor GST of each NAND string NS. In other words, a plurality of memory cells may be realized in each memory block 330 of the memory blocks 152, 154 and 156 of the memory device 150

In order to process a large amount of data in a memory system, the controller may perform multiple I/O operations to the memory device. An I/O operation includes a foreground operation and a background operation. For example, the controller may issue a command to control a write operation to the memory device and conversely, the memory device may transmit a response corresponding to the issued command to the controller.

Due to the repeated communication between the controller and the memory device, the temperature of the memory device or each of the plurality of nonvolatile memories included in the memory device may rise above a threshold value, and as a result, the overall temperature of the memory system may continue to rise. This may cause a reduction in the performance of the overall memory system.

According to the present invention, the memory system can adjust the temperature of the memory device and/or each of the plurality of nonvolatile memories included in the memory device. More specifically the memory system can use a throttling scheme to adjust the temperature of the memory device. For example, the memory system may adjust the temperature of each of the plurality of nonvolatile memories included in the memory device. It is noted herein that although the throttling scheme is described in relation to a memory system employing a plurality of nonvolatile memories 510, the invention is not limited in this way. For example, the present invention may also be employed in a memory system including one or more volatile memories.

According to the throttling scheme, when the temperature value of the memory device and/or each of the plurality of nonvolatile memories included in the memory device is higher than the threshold value, the controller does not issue a command to the memory device and/or each of the plurality of nonvolatile memories included in the memory device until the temperature value of the memory device or each of the plurality of nonvolatile memories included in the memory device is again below the threshold value.

Conventionally, in order to perform the throttling operation, the controller periodically issues additional command to the memory device and/or each of the plurality of nonvolatile memories included in the memory device to read the temperature value of the memory device and/or each of the plurality of the nonvolatile memories included in the memory device, and then performs a throttling operation based on the read temperature value.

However, as above, if the controller periodically reads the temperature value of the memory device and/or each of the plurality of the nonvolatile memories included in the memory device, the performance of the memory system may be reduced due to the repeated read operations.

Figure 5:
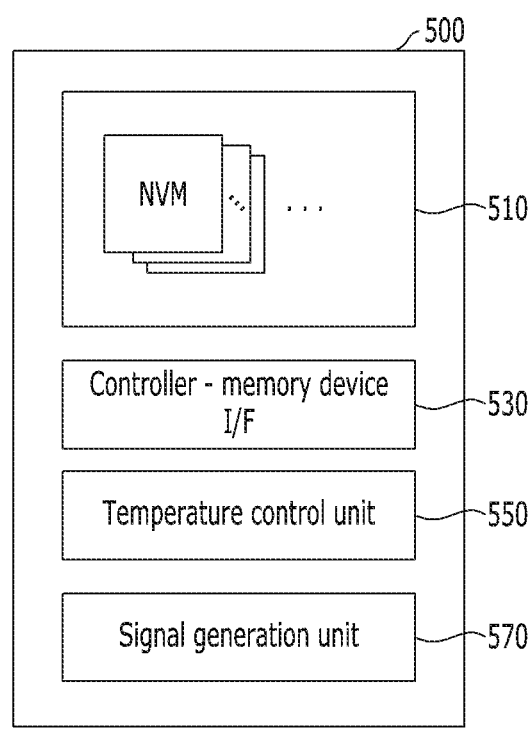
FIG. 5 is a block diagram illustrating a memory device in accordance with an embodiment of the present invention.

The present invention proposes a solution for solving the above problems. Hereafter, the operation of the memory system 110 in accordance with an embodiment of the present invention is described in detail with reference to FIGS. 5 to 6. FIG. 5 is a block diagram illustrating a structure of the memory device 500 including a plurality of nonvolatile memories in accordance with an embodiment of the present invention. The memory devices 500 corresponds to the memory device 150 show in FIG. 1. Referring now to FIG. 5, the memory device 500 may include in addition to the plurality of nonvolatile memories 510, a controller-memory device interface unit 530 (hereinafter referred to also simply as the interface unit 530), a temperature control unit 550, and a signal generation unit 570. The memory device 500 may correspond to the memory device 150 of FIG. 1.

The plurality of nonvolatile memories 510 may be controlled by the controller 130 based on a command issued from the host 102. For example, one or more nonvolatile memories of the plurality of nonvolatile memories 510 may be controlled by the controller 130 to perform a write operation based on a write command issued from the host 102. The temperature of the one or more nonvolatile memories which are controlled to perform the write operation may rise due to the performance of the write operation. Further, when write operations are performed repeatedly to the same nonvolatile memory, the temperature of the nonvolatile memory may rise to a value that is higher than a predetermined threshold temperature.

The interface unit 530 may perform an interface operation of processing a command and a data between the controller 130 and the memory device 500. Particularly, the interface unit 530 may transfer data between the controller 130 and the memory device 500. For example, when the controller 130 generates a control signal to control the memory device 500 in response to a request of the host 102, the interface 530 may receive the control signal and process the control signal to the memory device 500. Conversely, the interface unit 530 may transmit a response from the memory device 500 to the controller 130.

The temperature control unit 550 may set a threshold temperature for the memory device 500 or for each of the plurality of nonvolatile memories 510. Specifically, after the memory system 110 is booted, the controller 130 may receive a temperature setting command issued by the host 102. The controller 130 may issue the received temperature setting command to the memory device 500, and the threshold temperature T1 for the memory device 500 or for each of the plurality of the nonvolatile memories 510 may be set in response to the temperature setting command. Based on the set threshold temperature T1, the temperature of the memory device 500 or of each of the plurality of the nonvolatile memories 510 may be adjusted efficiently.

Also, the temperature control unit 550 may sense temperature of the memory device 500 and each of the plurality of the nonvolatile memories 510 periodically. Specifically, the temperature control unit 550 may sense the temperature of the memory device 500 and each of the plurality of the nonvolatile memories 510 at a predetermined time intervals (for example, once every several microseconds), and the sensed temperature may be used by the controller 130 as information for selecting one or more target nonvolatile memories 510 to be throttled. In other words, the memory device 500 may determine the temperature of the memory device 500 and/or each of the plurality of nonvolatile memories 510 through the temperature control unit 550.

Furthermore, the temperature control unit 550 may determine whether the sensed temperature is higher than, or equal to or lower than the threshold temperature T1 by comparing the temperature of the memory device 500 and/or each of the plurality of nonvolatile memory device 510 with the threshold temperature T1. If the sensed temperature is higher than the threshold temperature T1, the controller 130 may throttle the memory device 500 and/or one or more of the nonvolatile memories.

The signal generation unit 570 may generate a signal to be provided to the controller 130. In particular, the signal generation unit 570 may generate a signal including information of comparison results between the temperature of the memory device 500 and/or each of the plurality of nonvolatile memories 510 and the threshold temperature T1. For example, when the controller 130 issues a read command to the memory device 500, the signal generation unit 570 may generate a signal in response to the read command by adding the information of comparison results between the temperature of the memory device 500 and/or each of the plurality of the nonvolatile memories 510 and the threshold temperature T1.

Specifically, the information of comparison results between the temperature of the memory device 500 and/or each of the plurality of nonvolatile memories 510 and the threshold temperature T1 may has a size of predetermined bit. Hereinafter, for the sake of convenience in description, it is assumed that the information has a size of 1 bit.

When the temperature of the memory device 500 and/or each of the plurality of nonvolatile memories 510 is higher than the threshold temperature T1, the bit value of the information may be represented by '1'. When the bit value of the information is represented by '1', the signal generation unit 570 may generate a busy signal for the memory device 500 and/or one or more of the nonvolatile memories 510, and as described above, the memory device 500 and/or one or more of the nonvolatile memories 510 may be throttled.

On the other hand, when the temperature of the memory device 500 and/or each of the plurality of nonvolatile memories 510 is equal to or lower than the threshold temperature T1, the bit value of the information may be represented by '0'. When the bit value of the information is represented by '0', the signal generation unit 570 may generate a ready signal for the memory device 500 and/or one or more of the nonvolatile memories 510. A ready signal for the memory device 500 means that operations for the memory device 500 may proceed without any throttling. When a busy signal is generated for one or more of the nonvolatile memories 510, operations for the one or more nonvolatile memories with the busy signal are throttled. The throttling for a nonvolatile memory may last until a ready signal is generated for the nonvolatile memory device.

Furthermore, when the temperature of the memory device 500 and/or one or more of the nonvolatile memories which was previously higher than the threshold temperature T1 (i.e., for those nonvolatile memories which are subjected to throttling) becomes equal to or lower than the threshold temperature T1, the signal generation unit 570 may then generate a ready signal for the memory device 500 and/or one or more of the nonvolatile memories, and vice versa.

Furthermore, the signal generation unit 570 may add the busy or ready signal to the response to the command issued by the controller 130.

For the sake of convenience in description, it is assumed that the bit value of the response to the command issued by the controller 130 is '01001100', and the added bit is added to the most significant bit of the response bit. This is a simple assumption, but not limited thereto. For example, when the temperature of the nonvolatile memory is higher than the threshold value, the voltage generation unit 570 may generate '101001100' by adding the bit value '1' representing the busy signal to the response for the read command. On the other hand, when the temperature of the nonvolatile memory is equal to or lower than the threshold value, the voltage generator 570 may generate '001001100' by adding the bit value '0' representing the ready signal to the response for the read command. The generated response may then be transmitted to the controller 130 through the interface unit 530.

Figure 6:
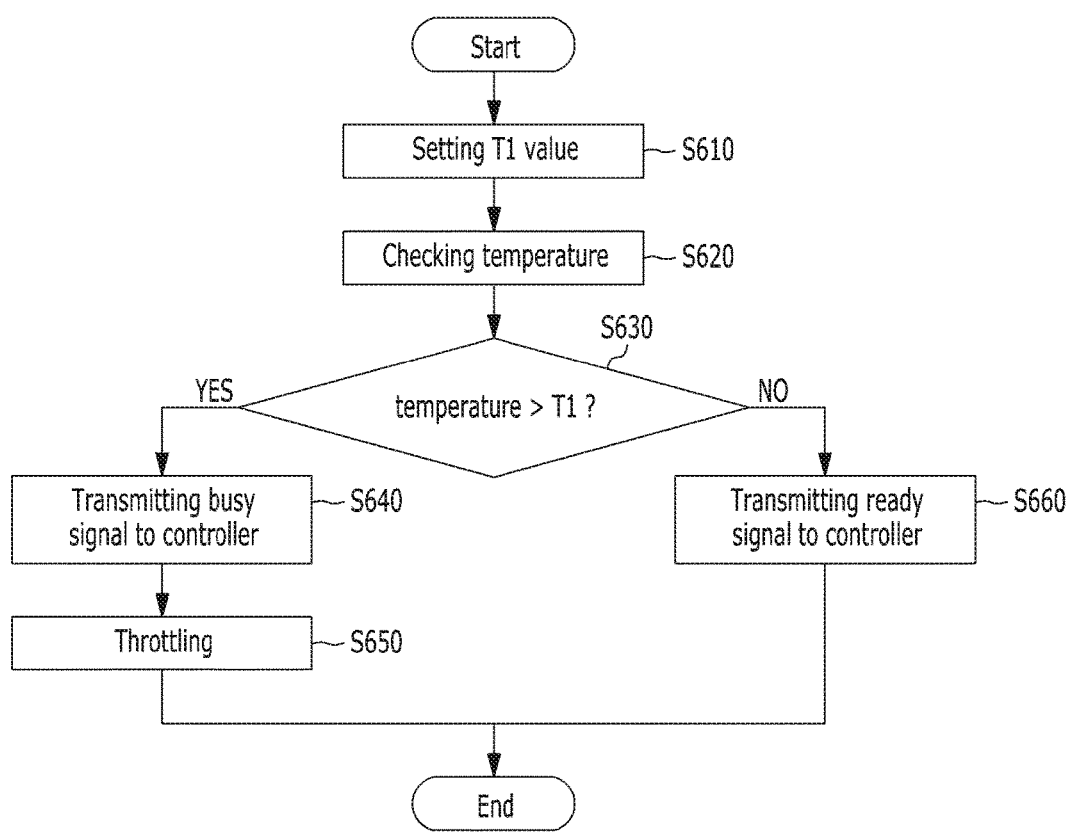
FIG. 6 is a flowchart describing an operation of memory device in accordance with the embodiment of the present invention.

FIG. 6 is a flowchart describing an operation of the memory system 110, in accordance with an embodiment of the present invention.

Referring to FIG. 6, in step S610, the temperature control unit 550 may set the threshold temperature T1 for the memory device 500 and/or each of the plurality of the nonvolatile memories 510 based on a temperature setting command issued by the host 102. The temperature setting command may be transmitted to the temperature control unit 550 via the controller 130 and the interface 530.

In step S620, the temperature control unit 550 may check (or sense) the temperature of the memory device 500 and/or each of the plurality of the nonvolatile memories 510 at predetermined time intervals, for instance periodically, every several microseconds.

In step S630, the temperature control unit 550 may compare the sensed temperature of the memory device 500 and/or each of the plurality of nonvolatile memories 510 with the predetermined threshold temperature T1.

If the temperature of the memory device 500 and/or each of the plurality of nonvolatile memories 510 is higher than the predetermined threshold temperature T1 ("YES" of step S630), in step S640, the signal generation unit 570 may generate the busy signal for the memory device 500 and/or one or more of the plurality of the nonvolatile memories, and transmit the busy signal to the controller 130 through the interface unit 530.

In step S650, the controller 130 having received the busy signal may then throttle the memory device 500 and/or one or more of the nonvolatile memories which have a temperature that is higher than the threshold temperature T1. Throttling means that the controller 130 may not issue a command to the memory device 500 and/or one or more of the nonvolatile memories. Furthermore, although not shown, when the temperature of the memory device 500 and/or one or more of the nonvolatile memories which is higher than the threshold temperature T1 becomes equal to or lower than the threshold temperature T1, the controller 130 may again perform an I/O operation, such as a program operation, for the memory device 500 and/or one or more of the nonvolatile memories.

On the other hand, when the temperature of the memory device 500 and/or each of the plurality of nonvolatile memories 510 is equal to or lower than the predetermined threshold temperature T1 ("NO" of step S630), in step S660, the signal generation unit 570 may generate a ready signal for the memory device 500 and/or one or more of the nonvolatile memories, and transmit the ready signal to the controller through the interface unit 530. Furthermore, although not shown, the controller 130 may proceed to perform an I/O operation, such as a program operation, for the memory device 500 and/or one or more of the nonvolatile memories.

Although not shown, in step S610, the threshold temperature T1 may be set only when the temperature setting command is issued by the host 102 after the memory system 110 is booted. On the other hand, step S620 to S660 may be performed repeatedly at predetermined time intervals, e.g., periodically every several microseconds.

In the memory system in accordance with an embodiment of the present invention, the memory device 500 may sense the internal temperature on its own, and may transmit temperature information to the controller 130 by comparing the internal temperature with a predetermined threshold temperature T1. In other words, the memory device 500 may adjust its temperature without waiting for a command to be issued by the controller 130. As a result, the temperature control process of sensing the temperature from the memory device in the controller and of throttling the memory device based on the sensed temperature may be simplified. Therefore, the performance of the memory system 110 may be improved due to the controller 130 does not have to issue a command to control the temperature of the memory device 500 periodically. This may reduce the overall load on the controller 130 and may speed up the processing of data to and from the memory device 500.

Hereafter, a data processing system and electronic devices to which the memory system 110 including the memory device 150 and the controller 130, which are described above by referring to FIGS. 1 to 6, in accordance with the embodiment of the present invention will be described in detail with reference to FIGS. 7 to 15.

Figure 7:
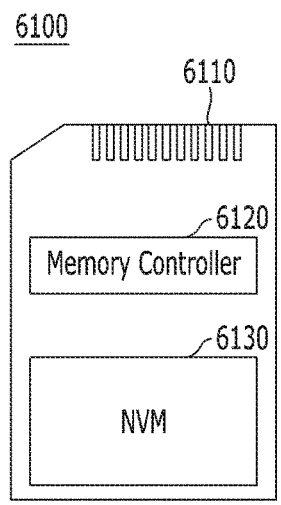
FIGS. 7 to 15 are diagrams schematically illustrating application examples of the data processing system, in accordance with various embodiments of the present invention.

FIG. 7 is a diagram schematically illustrating another example of the data processing system including the memory system in accordance with the present embodiment. FIG. 7 schematically illustrates a memory card system to which the memory system in accordance with the present embodiment is applied.

Referring to FIG. 7, the memory card system 6100 may include a memory controller 6120, a memory device 6130 and a connector 6110.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the memory system 110 described with reference to FIG. 1, and the memory device 6130 may correspond to the memory device 150, 500 of the memory system 110 described with reference to FIGS. 1, and 5.

Thus, the memory controller 6120 may include a RAM, a processing unit, a host interface, a memory interface and an error correction unit.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with the present embodiment may be applied to wired/wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device. For example, the memory controller 6120 and the memory device 6130 may construct a solid-state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 8:
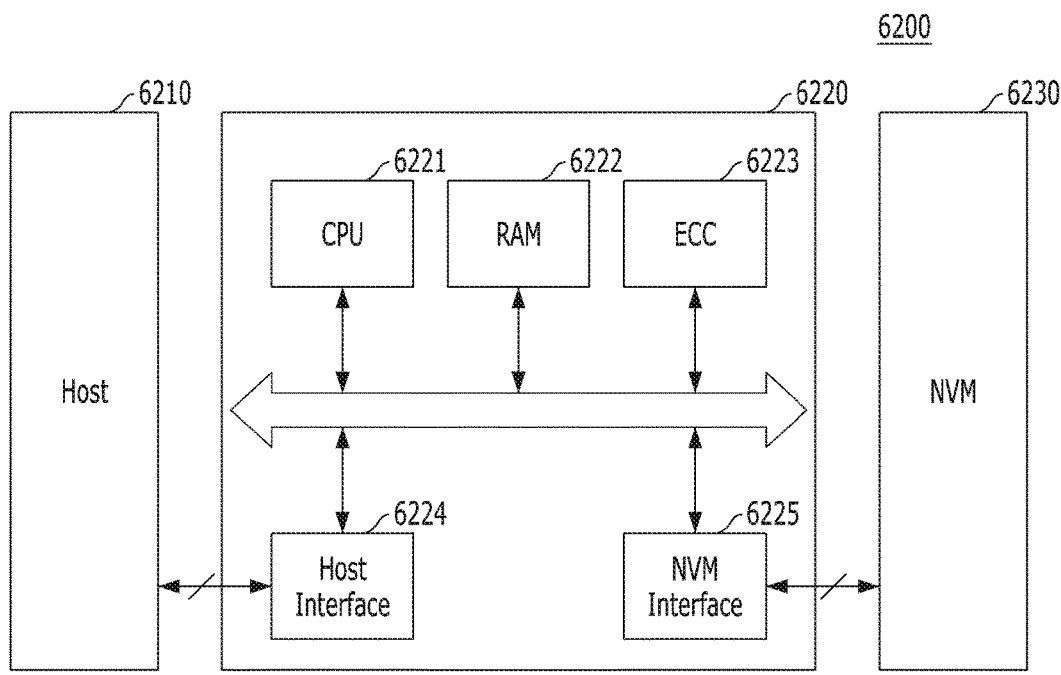

FIG. 8 is a diagram schematically illustrating another example of the data processing system including the memory system in accordance with the present embodiment.

Referring to FIG. 8, the data processing system 6200 may include a memory device 6230 having one or more nonvolatile memories and a memory controller 6220 for controlling the memory device 6230. The data processing system 6200 illustrated in FIG. 8 may serve as a storage medium such as a memory card (CF, SD, micro-SD or the like) or USB device, as described with reference to FIG. 1. The memory device 6230 may correspond to the memory device 150, 500 in the memory system 110 illustrated in FIGS. 1 and 5, and the memory controller 6220 may correspond to the controller 130 in the memory system 110 illustrated in FIG. 1.

The memory controller 6220 may control a read, write or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NUM interface 6225.

The CPU 6221 may control the overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC unit 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NUM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with the present embodiment may be applied to wired/wireless electronic devices or particularly a mobile electronic device.

Figure 9:
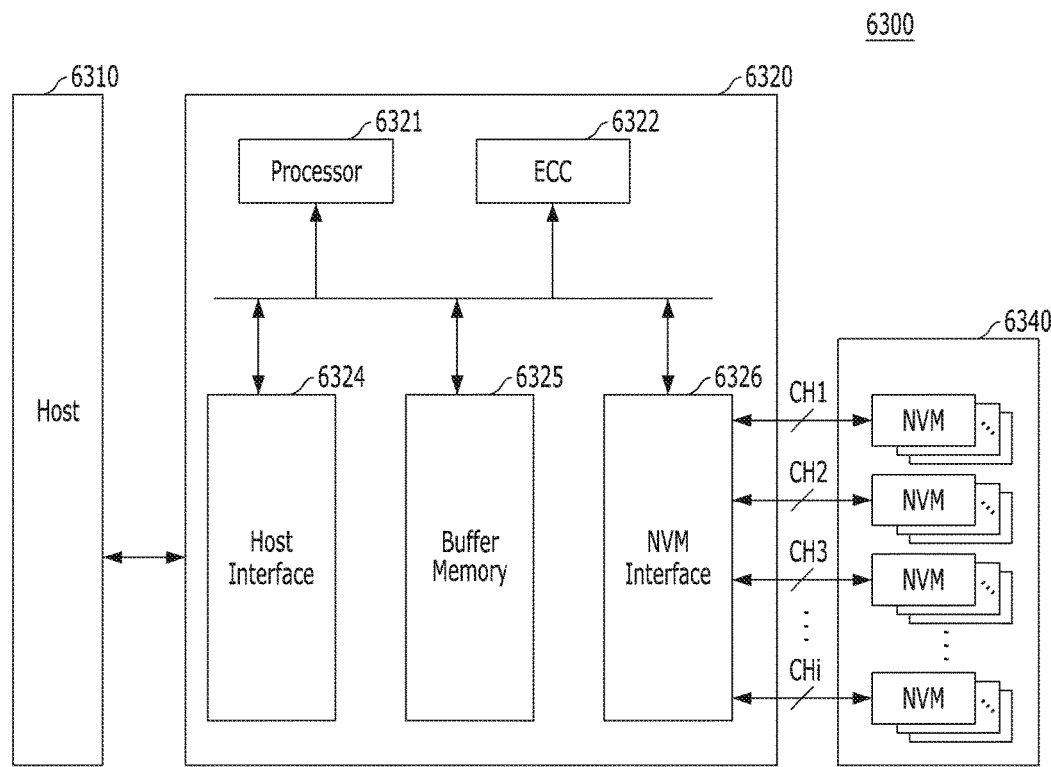

FIG. 9 is a diagram schematically illustrating another example of the data processing system including the memory system in accordance with the present embodiment. FIG. 9 schematically illustrates an SSD to which the memory system in accordance with the present embodiment is applied.

Referring to FIG. 9, the SSD 6300 may include a controller 6320 and a memory device 6340 including a plurality of nonvolatile memories. The controller 6320 may correspond to the controller 130 in the memory system 110 of FIG. 1, and the memory device 6340 may correspond to the memory device 150, 500 of FIGS. 1 and 5.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. For convenience of description, FIG. 8 illustrates that the buffer memory 6325 exists in the controller 6320. However, the buffer memory 6325 may exist outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, RAID (Redundant Array of Independent Disks) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 10:
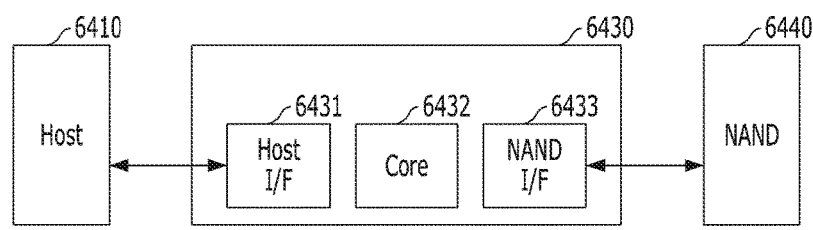

FIG. 10 is a diagram schematically illustrating another example of the data processing system including the memory system in accordance with the present embodiment. FIG. 10 schematically illustrates an embedded Multi-Media Card (eMMC) to which the memory system in accordance with the present embodiment is applied.

Referring to FIG. 10, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150, 500 of FIGS. 1 and 5.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control the overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, an MMC interface Furthermore, the host interface 6431 may serve as a serial interface, for example, UHS ((Ultra High Speed)-I/UHS-II) interface.

FIGS. 11 to 14 are diagrams schematically illustrating other examples of the data processing system including the memory system in accordance with the present embodiment. FIGS. 11 to 14 schematically illustrate UFS (Universal Flash Storage) systems to which the memory system in accordance with the present embodiment is applied.

Referring to FIGS. 11 to 14, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices or particularly mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired/wireless electronic devices or particularly mobile electronic devices through UFS protocols, and the UFS devices 6520, 6620, 6720 and 6820 and the UFS cards 6530, 6630, 6730 and 6830 may be embodied by the memory system 110 illustrated in FIG. 1. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 8 to 10, and the UFS cards 6530, 6630, 6730 and 6830 may be embodied in the form of the memory card system 6100 described with reference to FIG. 7.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720 and 6820 and the UFS cards 6530, 6630, 6730 and 6830 may communicate with each other through various protocols other than the UFS protocol, for example, UFDs, MMC, SD, mini-SD, and micro-SD.

Figure 11:
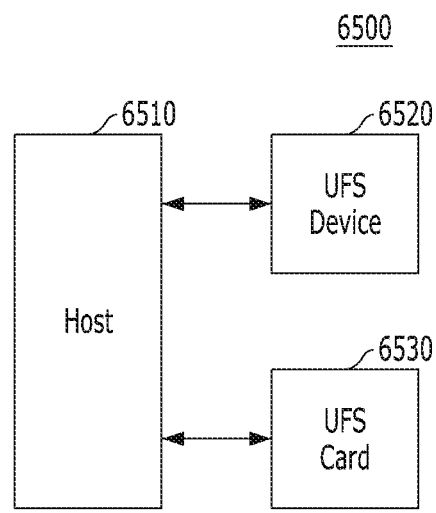

In the UFS system 6500 illustrated in FIG. 11, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. At this time, the UFS device 6520 and the UFS card 6530 may communicate with each other through link layer switching at the UniPro of the host 6510. In the present embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 12:
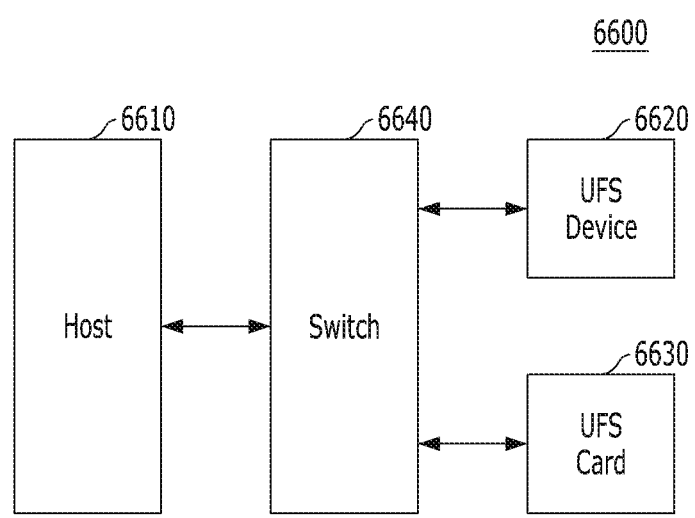

In the UFS system 6600 illustrated in FIG. 12, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the present embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 13:
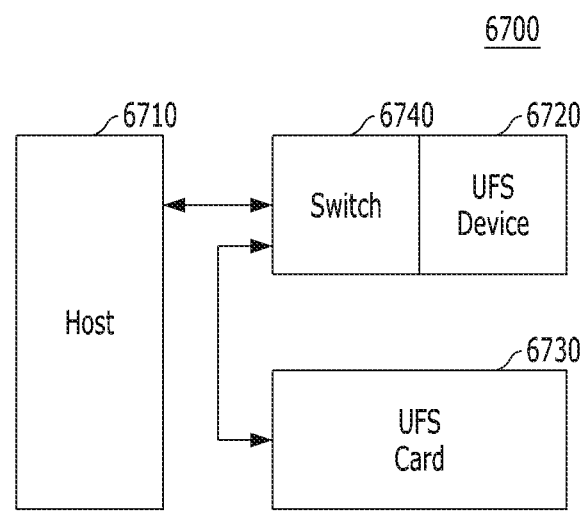

In the UFS system 6700 illustrated in FIG. 13, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In the present embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 14:
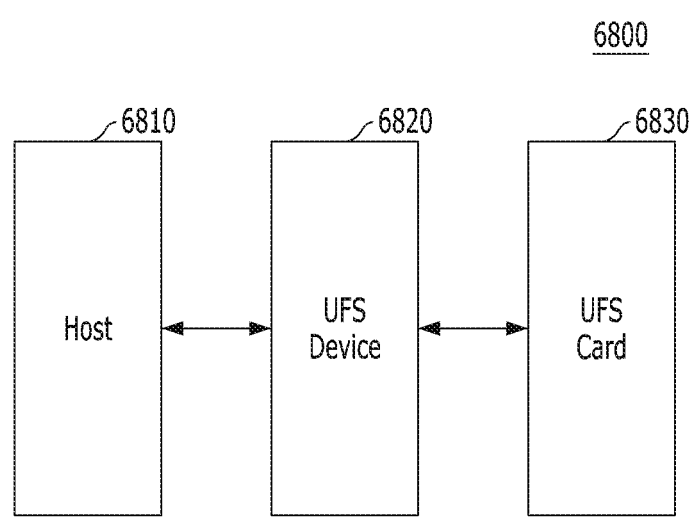

In the UFS system 6800 illustrated in FIG. 14, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. At this time, the host 6810 and the UFS card 6830 may communicate with each other through target ID switching between the M-PHY and UniPro modules of the UFS device 6820. In the present embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 15:
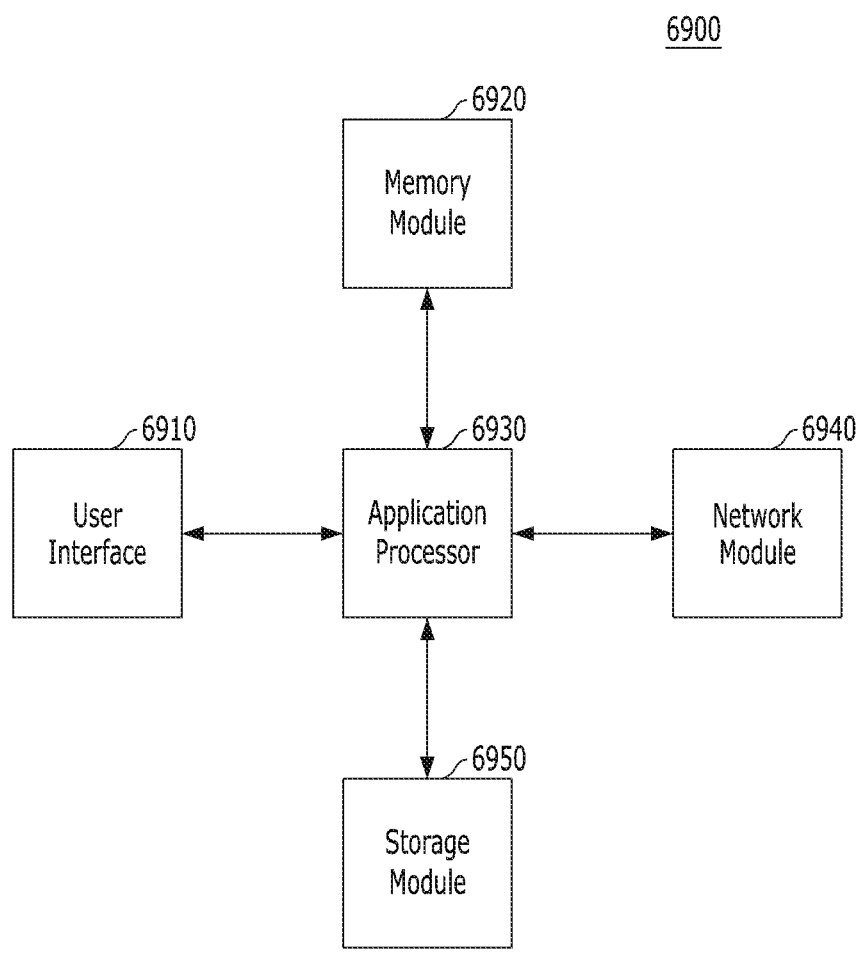

FIG. 15 is a diagram schematically illustrating another example of the data processing system including the memory system in accordance with an embodiment. FIG. 15 is a diagram schematically illustrating a user system to which the memory system in accordance with the present embodiment is applied.

Referring to FIG. 15, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as a System-on-Chip (SoC).

The memory module 6920 may be used as a main memory, work memory, buffer memory or cache memory of the user system 6900. The memory module 6920 may include a volatile RAM such as a DRAM, SDRAM, DDR SDRAM, DDR2 SDRAM, DDR3 SDRAM, LPDDR SDARM, LPDDR3 SDRAM or LPDDR3 SDRAM or a nonvolatile RAM such as PRAM, ReRAM, MRAM or FRAM. For example, the application processor 6930 and the memory module 6920 may be packaged and mounted, based on a POP (Package on Package).

The network module 6940 may communicate with external devices. For example, the network module 6940 may support wired communication, and also various wireless communication protocols such as a code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, may be applied to wired and/or wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, eMMC and UFS as described above with reference to FIGS. 9 to 14.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control the overall operations of the mobile electronic device, and the network module 6940 may serve as a communication module for controlling wired and/or wireless communication with an external device. The user interface 6910 may display data processed by the processor 6930 on a display/touch module of the mobile electronic device, or support a function of receiving data from the touch panel.

According to the embodiments of the present invention, a memory system is provided that is capable of adjusting the temperature of a memory device employed by the memory system in an efficient manner that puts less load on the controller of the memory system, thus allowing the controller to process data to and from the memory device faster and more reliably than existing systems.

While the present invention has been described with respect to the specific embodiments, it will be apparent to those skilled in the art that various changes and modifications may be made without departing from the spirit and scope of the invention as defined in the following claims.

What is claimed is:

1. A memory system comprising:
a controller;
a plurality of nonvolatile memories;
a temperature control unit suitable for measuring a temperature of each of the plurality of nonvolatile memories, and comparing each measured temperature with a predetermined threshold value;
a signal generation unit suitable for generating busy signals corresponding to one or more of the nonvolatile memories when the measured temperature is higher than the predetermined threshold value; and
an interface unit transmitting the busy signal to the controller,
wherein the busy signal consists of one or more bits added to the respective responses.

2. The memory system of claim 1,
wherein the controller controls the plurality of nonvolatile memories to perform operations by providing commands, and
wherein the plurality of nonvolatile memories generate response corresponding to the provided commands.

3. The memory system of claim 2, wherein the interface unit transmits the busy signals along with the responses.

4. The memory system of claim 3, wherein the controller controls, when receiving the busy signals, one or more nonvolatile memories corresponding to the received busy signals not to perform input/output operations.

5. The memory system of claim 2,
wherein the signal generation unit further generates ready signals corresponding to one or more of the nonvolatile memories when each of the measured temperature is equal to or lower than the predetermined threshold value, and
wherein the interface unit further transmits the ready signal to the controller.

6. The memory system of claim 5, wherein the interface unit transmits the ready signals along with the responses.

7. The memory system of claim 6, wherein the controller controls, when receiving the ready signals, one or more memories corresponding to the received busy signals to perform input/output operations.

8. The memory system of claim 6, wherein the ready signal consists of one or more bits added to the respective responses.

9. The memory system of claim 1, wherein the controller controls the memory device to set the predetermined threshold value based on a command issued from a host.

10. A method for operating a memory system, comprising:
measuring, by a memory device, a temperature of each of a plurality of nonvolatile memories;
comparing each of the measured temperature with a predetermined threshold value;
generating, by the memory device, busy signals corresponding to one or more of the nonvolatile memories when the measured temperature is higher than the predetermined threshold value; and
transmitting, by the memory device, the busy signal to the controller,
wherein the busy signal consists of one or more bits added to the respective responses.

11. The method of claim 10, further comprising:
controlling, by a controller, the plurality of nonvolatile memories to perform operations by providing commands; and
generating, by the memory device, response corresponding to the provided commands.

12. The method of claim 10, wherein the busy signal is transmitted along with the response.

13. The method of claim 12, further comprising controlling, by the controller when receiving the busy signals, one or more nonvolatile memories corresponding to the received busy signals not to perform input/output operations.

14. The method of claim 11, further comprising:
generating, by the memory device, ready signals corresponding to one or more of the nonvolatile memories when each of the measured temperature value is equal to or lower than the predetermined threshold value; and
transmitting, by the memory device, the ready signal to the controller.

15. The method of claim 14, wherein the ready signal is transmitted along with the response.

16. The method of claim 15, further comprising controlling, by the controller when receiving the ready signals, one or more memories corresponding to the received busy signals to perform input/output operations.

17. The method of claim 15, wherein the ready signal consists of one or more bits added to the respective responses.

18. The method of claim 10, further comprising controlling, by the controller, the memory device to set the threshold value based on a command issued from a host before the measuring of the temperature.

* * * * *